US009104588B2

(12) United States Patent
Mullarkey

(10) Patent No.: US 9,104,588 B2
(45) Date of Patent: Aug. 11, 2015

(54) CIRCUITS, APPARATUSES, AND METHODS FOR ADDRESS SCRAMBLING

(71) Applicant: Micron Technology, Inc., Boise, ID (US)

(72) Inventor: Patrick Mullarkey, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/783,035

(22) Filed: Mar. 1, 2013

(65) Prior Publication Data

US 2014/0250341 A1    Sep. 4, 2014

(51) Int. Cl.
*G11C 29/00* (2006.01)
*G06F 11/10* (2006.01)

(52) U.S. Cl.
CPC ............ *G06F 11/10* (2013.01); *G06F 11/1072* (2013.01); *G11C 29/70* (2013.01)

(58) Field of Classification Search
CPC ........ G11C 29/52; G11C 29/70; G06F 11/10; G06F 11/1072; G06F 11/1008; G06F 12/0638
USPC ........ 714/6.32, 746, 763–764, 767, 769, 770; 365/200
See application file for complete search history.

(56) References Cited

U.S. PATENT DOCUMENTS

| | | | |
|---|---|---|---|
| 5,943,283 A | 8/1999 | Wong et al. | |
| 6,084,807 A * | 7/2000 | Choi | 365/200 |
| 6,367,030 B1 * | 4/2002 | Yamauchi | 714/6.32 |
| 6,597,607 B2 * | 7/2003 | Koshita | 365/200 |
| 6,674,676 B1 | 1/2004 | Hsu et al. | |
| 6,836,441 B2 | 12/2004 | Park | |
| 7,281,114 B2 * | 10/2007 | Kita | 711/203 |
| 7,405,973 B2 | 7/2008 | Park | |
| 7,571,367 B2 | 8/2009 | Selva et al. | |
| 8,441,882 B2 | 5/2013 | Bollu | |
| 2005/0010789 A1 | 1/2005 | Liang | |
| 2007/0143568 A1 | 6/2007 | Gould | |
| 2010/0235564 A1 | 9/2010 | Ito | |

FOREIGN PATENT DOCUMENTS

WO    2012047200 A1    4/2012

OTHER PUBLICATIONS

International Search Report & Written Opinion dated Jun. 2, 2014 for Appln No. PCT/US2014/016472.
Office Action for TW application No. 103106563 dated Apr. 22, 2015.

* cited by examiner

*Primary Examiner* — Shelly A Chase
(74) *Attorney, Agent, or Firm* — Dorsey & Whitney LLP

(57) ABSTRACT

Circuits, apparatuses, and methods are disclosed for address scrambling in integrated circuits. One example apparatus includes a plurality of data regions, each of the plurality of data regions configured to provide a respective portion of data responsive to a physical address provided by a respective decode circuit. The plurality of data regions are configured to provide their respective portions of data responsive to a common logical address. The common logical address is scrambled such that a plurality of different physical addresses are provided to the plurality of data regions.

33 Claims, 8 Drawing Sheets

CIRCUITS, APPARATUSES, AND METHODS FOR ADDRESS SCRAMBLING

TECHNICAL FIELD

Embodiments of the invention relate generally to integrated circuits, and more particularly, in one or more of the illustrated embodiments, to address scrambling in integrated circuit repair.

BACKGROUND OF THE INVENTION

In order to improve yield in integrated circuit manufacturing, redundant portions of circuitry are frequently included in integrated circuit designs. The redundant circuitry can be used to repair inoperable portions of the integrated circuit under some conditions if certain rerouting steps are taken. In a memory, for example, one or more portions of one or more data storage regions may be inoperable because of defects from semiconductor processing. If redundant circuitry is included in the memory, however, data that would otherwise be stored in the inoperable portion of the array may be rerouted to and from the redundant circuitry.

The redundant circuitry may be local or global. Continuing with the example of memory, if the memory array includes several data regions, local redundant circuitry may be located within each of the data regions, but can only be used to repair inoperable portions in the respective data region where it is located. Global redundant circuitry, on the other hand, may not be located in the data regions, but may be located in a separate, global repair region. As such, the global redundant circuitry can be used to repair inoperable portions of any of a plurality of different data regions. However, if the global repair region has only a single input/output (I/O) bus, only one set of data can be provided to or from the global repair region at a time. If the global repair region includes, for example, 40 columns of redundant data storage circuitry, those redundant columns can be used to repair 40 inoperable columns in a single data region, or in a plurality of different data regions. However, the global repair region can only read from or write to a single column of the global redundant circuitry at a time due to the single I/O bus. Thus, if column 1, for example, is to be read from (or written to) in each of the plurality of data regions at substantially the same time, the use of the global repair region is restricted to repairing column 1 in a single data region by rerouting the logical address of an inoperable portion in that data region to a physical address of redundant circuitry. If the global repair region is used to try to repair the same physical column in a plurality of different data regions, when that column is to be read out, the global repair region would output data from the plurality of different repairs for that column at the same time, thus causing contention on the single I/O bus for the global repair region.

Global repair thus generally works well when the physical locations of the inoperable portions of the integrated circuit are relatively randomly located. In practice, however, integrated circuit defects typically follow a pattern. For example, in a memory array with a plurality of data regions, it is common to have the edge columns of the data regions fail, whereas it is less likely to have inner columns of the data regions fail. In other words, in a memory array with several data regions, defects are likely to occur at similar physical addresses within several of the data regions. These defects may be caused by, for example, breaks in uniformity at the edges of the data regions. In a system with a plurality of data regions where logical addresses are mapped directly to associated physical addresses, global repair cannot be used to repair the same address in more than one data region, as described above.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
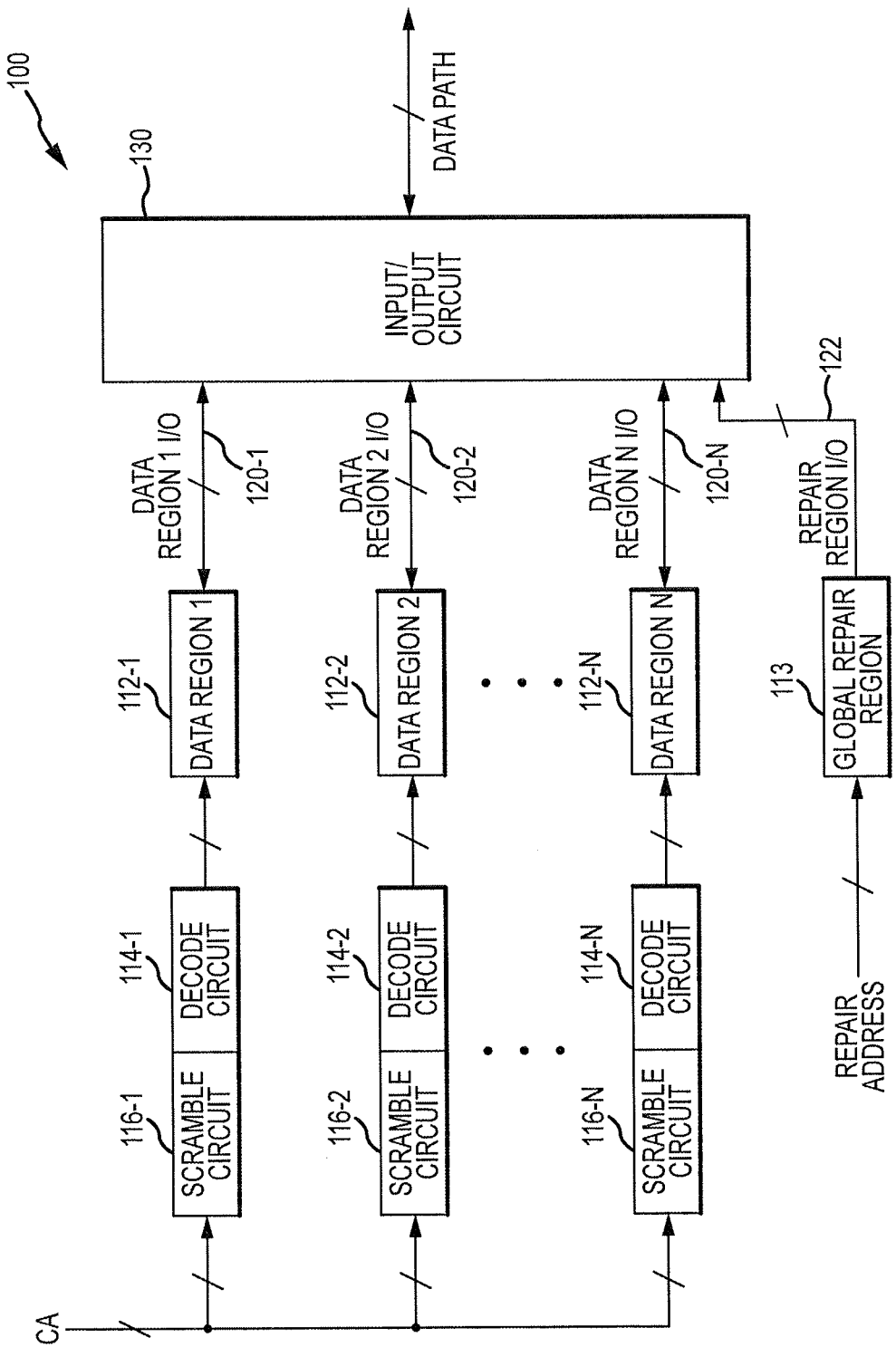
FIG. 1 is a block diagram of an apparatus with address scrambling according to an embodiment of the present invention.

FIG. 1 illustrates an apparatus 100 including a plurality of data regions 112-1, 112-2 . . . 112-N according to an embodiment of the invention. As used herein, apparatus may refer to, for example, an integrated circuit, a memory device, a memory system, an electronic device or system, a smart phone, a tablet, a computer, a server, etc.

Each of the plurality of data regions 112-1, 112-2 . . . 112-N are configured to store data, and may include columns of volatile and/or non-volatile memory cells in some embodiments. For example, each of the plurality of data regions 112-1, 112-2 . . . 112-N may include storage for 128 columns of data, with each column of data including one or more bits of data (e.g., 8 bits of data per column). In some examples, one or more of the plurality of data regions 112-1, 112-2 . . . 112-N may include local redundant circuitry that can be used for local repair of the respective data region 112-1, 112-2 . . . 112-N. Also, in some examples, the data regions 112-1, 112-2 . . . 112-N may share a similar or identical topography.

A plurality of decode circuits 114-1, 114-2 . . . 114-N are coupled to the respective plurality of data regions 112-1, 112-2 . . . 112-N and provide physical addresses (such as a physical column address) for accessing locations in the data regions 112-1, 112-2 . . . 112-N associated with the physical addresses provided. The plurality of decode circuits 114-1, 114-2 . . . 114-N may include for example a plurality of logic gates (such as inverters and NAND gates) configured to decode column addresses such that for any given combination of physical addresses provided to the plurality of decode circuits 114-1, 114-2 . . . 114-N, a single column in the respective data region 112-1, 112-2 . . . 112-N is accessed.

The column may be accessed in that data may be read out from and/or may be written into the column.

A plurality of scramble circuits 116-1, 116-2 ... 116-N are respectively coupled to the plurality of decode circuits 114-1, 114-2 ... 114-N, and may scramble a common logical address into respective scrambled logical addresses for different data regions 112-1, 112-2 ... 112-N, which may be provided to the plurality of decode circuits 114-1, 114-2 ... 114-N to in turn generate respective physical addresses for accessing the plurality of data regions 112-1, 112-2 ... 112-N. In this manner, through the scramble circuits 116-1, 116-2 ... 116-N and the decode circuits 114-1, 114-2 ... 114-N, a common logical address may be associated with a first scrambled logical address for the first data region 112-1 (through the scramble circuit 116-1), which in turn may be associated with a first physical column address in the first data region 112-1 (through the decode circuit 114-1). The same logical address may be associated with a second scrambled logical address for the second data region 112-2 (through the scramble circuit 116-2), which in turn may be associated with a second physical column address in the second data region 112-2 (through the decode circuit 116-2).

The apparatus 100 also includes an input/output circuit 130 coupled to the plurality of data regions 112-1, 112-2 ... 112-N, with respective I/O buses 120-1, 120-2 ... 120-N coupling the respective data regions 112-1, 112-2 ... 112-N to the input/output circuit 130. For example, the first data region 112-1 is coupled to the input/output circuit 130 via a first I/O bus 120-1, and so forth. The input/output circuit 130 may further be coupled to a data path, over which the input/output circuit 130 may receive and/or provide data. In some examples, the input/output circuit 130 may include a plurality of buffers such that data is provided to or received from of the input/output circuit 130 in a burst mode.

The apparatus 100 also includes a global repair region 113 that is coupled to the input/output circuit 130 via a repair region I/O bus 122. The global repair region 113 includes redundant circuitry that can be used to repair portions (e.g., columns) of any one or a plurality of the data regions 112-1, 112-2 ... 112-N.

In operation, a common logical address CA is provided as input to each of the plurality of scramble circuits 116-1, 116-2 ... 116-N. The plurality of scramble circuits 116-1, 116-2 ... 116-N scramble the common logical address and respectively provide a plurality of scrambled logical addresses. The respective scrambled logical addresses are provided to the respective decode circuits 114-1, 114-2 ... 114-N, which in turn provide respective physical addresses to respective ones of the plurality of data regions 112-1, 112-2 ... 112-N.

The data regions 112-1, 112-2 ... 112-N, in response, provide a respective portion of data responsive to the physical address provided by the respective decode circuit 114-1, 114-2 ... 114-N. In some embodiments, two or more of the plurality of data regions 112-1, 112-2 ... 112-N provide their respective portions of data at substantially the same time (e.g., within a few picoseconds) responsive to the common logical address CA. For example, if the common logical address is column 1, each of the plurality of data regions 112-1, 112-2 ... 112-N may provide data from a physical column associated with the common logical address of 1. In addition to being able to read data from the data regions 112-1, 112-2 ... 112-N, the data regions 112-1, 112-2 ... 112-N may also be configured to receive and store portions of data at locations associated with respective received physical addresses. In general, the locations associated with the physical addresses provided to the data regions 112-1, 112-2 ... 112-N may be accessed, whether such access includes reading from and/or writing to the data regions 112-1, 112-2 ... 112-N.

In the event that one or more portions (e.g., columns) of circuitry in one or more of the data regions 112-1, 112-2 ... 112-N is determined to be inoperable, or is determined to likely be inoperable, the global repair region 113 may be used to repair this inoperable or likely inoperable circuitry.

During manufacturing, the data regions 112-1, 112-2 ... 112-N are frequently tested to verify operability. If one or more columns or other portions of one or more of the data regions 112-1, 112-2 ... 112-N are determined to be inoperable, the redundant circuitry in the global repair region 113 can be used in place of the inoperable circuitry in the data regions 112-1, 112-2 ... 112-N. To reroute data to and from the redundant circuitry in the global repair region 113 instead of to and from the inoperable circuitry in the data regions 112-1, 112-2 ... 112-N, a circuit may be programmed (e.g., a fuse may be blown) at, for example, the wafer level, by which one or more columns in the global repair region 113 will be accessed when an associated logical address is provided to the apparatus 100. The redundant circuitry in the global repair region 113 is accessed by the input/output circuit 130 via the I/O bus 122, and the input/output circuit 130 may provide the data from the global repair region 113 instead of what otherwise would have been provided from the inoperable circuitry in the one or more data regions 112-1, 112-2 ... 112-N. In some examples, the global repair region 113 may not be used at all (e.g., if there is no inoperable circuitry that cannot be repaired by local redundant circuitry), redundant circuitry in the global repair region 113 may be used to repair columns in one data region 112-1, 112-2 ... 112-N, or redundant circuitry in the global repair region 113 may be used to repair one or more columns in a plurality of different data regions 112-1, 112-2 ... 112-N. However, as previously described with reference to the conventional arts, if the global repair region 113 only has a single I/O bus 122, the global repair region 113 can only provide data from or write data into one of the redundant columns at a time, thus restricting the use of the global repair region 113 due to the single I/O bus 122.

Referring still to FIG. 1, the scramble circuits 116-1, 116-2 ... 116-N may be configured to scramble the common logical addresses to reduce the probability that the limitations related to a single I/O bus 122 for the global repair region 113 will prevent the data regions 112-1, 112-2 ... 112-N from being repaired using the redundant circuitry in the global repair region 113—which may otherwise result in the integrated circuit with the inoperable circuitry being discarded. As mentioned above, repeating defects may occur in integrated circuit manufacturing—e.g., several of the data regions 112-1, 112-2 ... 112-N may each have a similar (physical) location with inoperable circuitry, such as edge columns. The common logical addresses may be scrambled (as described in more detail below with reference to FIG. 2) such that the repeating defect is located in columns associated with different logical addresses across the data regions 112-1, 112-2 ... 112-N notwithstanding that the repeating defect is located in columns with similar physical addresses across the data regions 112-1, 112-2 ... 112-N. In other words, by ensuring that a common logical address is associated with different physical addresses in each of the plurality of different data regions 112-1, 112-2 ... 112-N, the restriction on globally repairing columns in different data regions 112-1, 112-2 ... 112-N with a similar physical address may be reduced. Viewed another way, the scrambling of a common logical address may result in a similar physical address for the plurality of data regions 112-1, 112-2 . . . 112-N (e.g., a similar physical address associated with a location that is likely to be inoperable) being associated with different scrambled logical addresses. In general, the physical addresses of one or more columns in one data region 112-1 may be associated with scrambled logical addresses different than the scrambled logical addresses for similar physical columns in another data region 112-2, or a common logical address may be associated with a plurality of different physical addresses in the plurality of data regions 112-1, 112-2 . . . 112-N.

The scrambling may take many different forms. For example, in one embodiment, one digit (e.g., the least significant bit or LSB) of the common logical address may be provided as-is to a first data region 112-1, and may be swapped with another digit (e.g., the second to least significant bit) when provided to the second data region 112-2. As another example, the least significant bit may be swapped with a middle bit or the most significant bit (MSB) of the common logical address. As still another example, the entire common logical address may be inverted when provided to the second data region 112-2.

In embodiments with more than two data regions 112-1, 112-2 . . . 112-N, at least two of the data regions 112-1, 112-2 . . . 112-N may have different scrambled logical addresses provided to them, including all of the data regions 112-1, 112-2 . . . 112-N having different scrambled logical addresses provided to them. In one example, there may only be two different logical address scrambling arrangements—one for one half of the data regions 112-1, 112-2 . . . 112-N, and the other for the other half of the data regions 112-1, 112-2 . . . 112-N. In another example, each of the plurality of data regions 112-1, 112-2 . . . 112-N may have a distinct scrambling of logical addresses. In general, any data region 112-1, 112-2 . . . 112-N may have any number of swapped or inverted logical addresses.

The scrambling of the common logical address to provide scrambled logical addresses may be done such that similar physical locations within the data regions 112-1, 112-2 . . . 112-N that are most likely to fail have different scrambled logical addresses (e.g., by scrambling the decoding for the column select). Stated another way, different physical addresses within the data regions 112-1, 112-2 . . . 112-N may be associated with a common logical address. In this manner, the global repair region 113 can be used to repair inoperable circuitry more effectively. For example, if the edges of the data regions 112-1, 112-2 . . . 112-N are likely to have consistent defects, the scrambled logical addresses may be selected such that no two data regions have an edge column with the same effective scrambled logical address—so physical column address 1 in data region 112-1 may be associated with scrambled logical address 1, physical column address 1 in data region 112-2 may be associated with scrambled logical address 15, physical column address 1 in data region 112-3 may be associated with scrambled logical address 19, and so forth.

The effect of scrambling common logical addresses in this manner may be that common repair patterns appear random to the repair circuit (even though the scrambled logical addresses may be predetermined and set before the integrated circuit is packaged, and thus the scrambling is anything but "random"), thus improving the probability that the redundant circuitry in the global repair region 113 can be successfully used to repair inoperable portions of the data regions 112-1, 112-2 . . . 112-N by reducing the probability of conflicting address repairs. Furthermore, because the common logical address is scrambled in the scramble circuits 116-1, 116-2 . . . 116-N, the repair circuitry (e.g., global repair region 113) does not need to be changed to reflect the different scrambled logical addresses.

Figure 2:
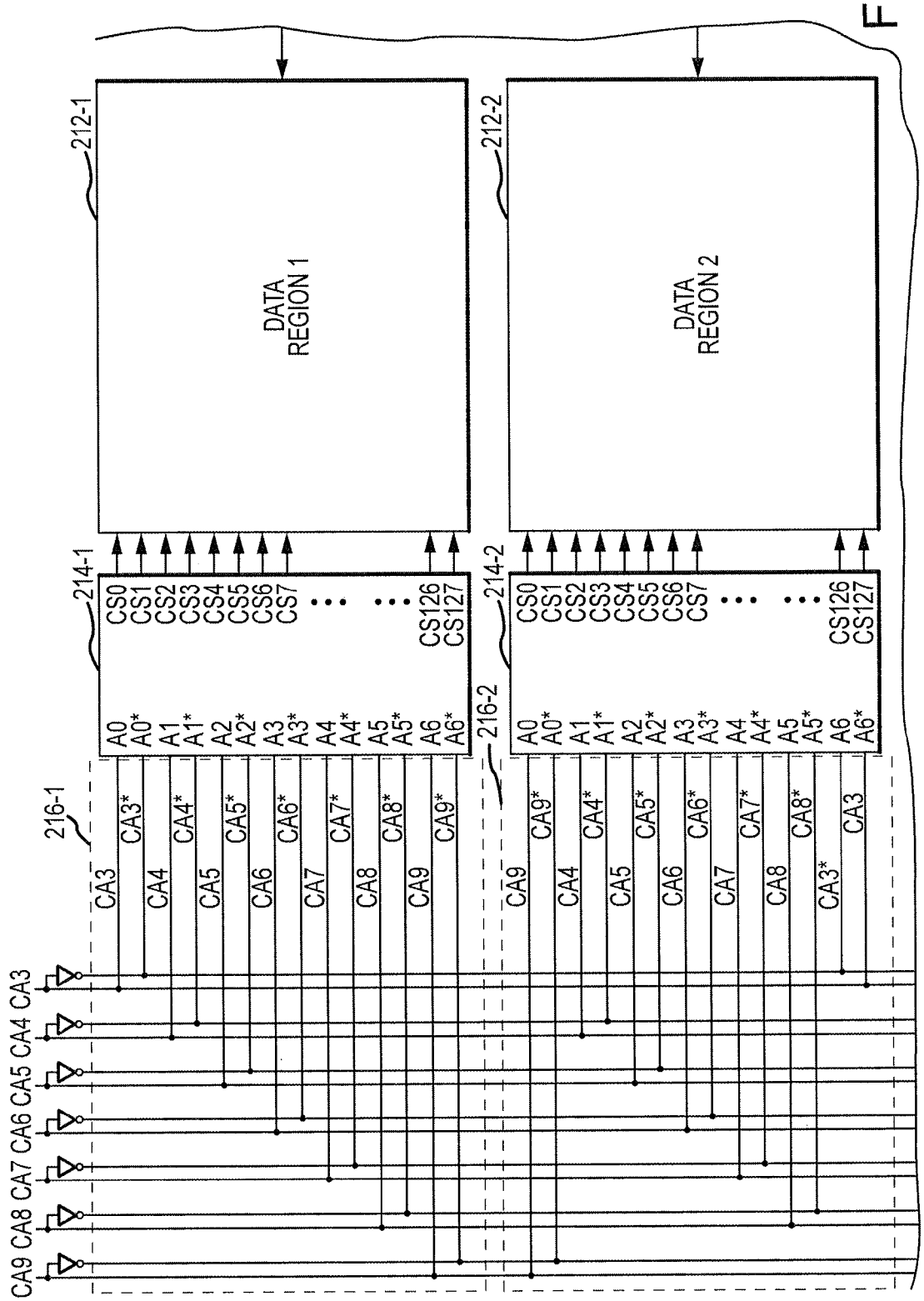
FIG. 2 is an enlarged portion of the apparatus in FIG. 1 to an embodiment of the invention.

FIG. 2 illustrates a portion of the apparatus 100 from FIG. 1 according to an embodiment of the invention. In FIG. 2, two scramble circuits 216-1, 216-2, two decode circuits 214-1, 214-2, and two data regions 212-1, 212-2 that may be used in the apparatus 100 from FIG. 1 are illustrated.

The scramble circuit 216-1 coupled to the first data region 212-1 includes interconnections between several bits of the common logical address CA (e.g., bits CA9:CA3) and the first decode circuit 214-1. The scramble circuit 216-1 in FIG. 2 includes an interconnect between bit CA3 of the common logical address CA and input node A0 of the decode circuit 214-1, an interconnect between an inverted version of bit CA3 of the common logical address CA to input node A0* of the decode circuit 214-1, and so forth, all the way down to an interconnect between bit CA9 of the common logical address CA and input node A6 of the decode circuit 214-1 and an interconnect between an inverted version of bit CA9 of the common logical address CA and input node A6* of the decode circuit 214-1. Thus, the scramble circuit 216-1 provides a first scrambled logical address to the first decode circuit 214-1 (e.g., CA3, CA4, CA5, CA6, CA7, CA8, CA9 for A0, A1, A2, A3, A4, A5, A6, and CA3*, CA4*, CA5*, CA6*, CA7*, CA8*, CA9* for A0*, A1*, A2*, A3*, A4*, A5*, A6*, all respectively). The first decode circuit 214-1 provides physical addresses (e.g., including bits CS127:CS0) to the data region 212-1 that are based on the first scrambled logical addresses from the scramble circuit 216-1.

The second scramble circuit 216-2 in FIG. 2, however, includes different interconnects and thus provides a different scrambled logical address to the second decode circuit 214-2. The second scramble circuit 216-2 includes an interconnect between bit CA3 of the common logical address CA and input node A6* of the decode circuit 214-2, an interconnect between an inverted version of bit CA3 of the common logical address CA to input node A6 of the decode circuit 214-2, an interconnect between bit CA9 of the common logical address CA and input node A0 of the decode circuit 214-22 and an interconnect between an inverted version of bit CA9 of the common logical address CA and input node A0* of the decode circuit 214-2. In this manner, two or more bits of the common logical address CA have been swapped in the second scramble circuit 216-2 (relative to how they were connected in the first scramble circuit 216-1) to provide a second scrambled logical address that is different than the first scrambled logical address (e.g., CA9, CA4, CA5, CA6, CA7, CA8, CA3* for A0, A1, A2, A3, A4, A5, A6, and CA9*, CA4*, CA5*, CA6*, CA7*, CA8*, CA3 for A0*, A1*, A2*, A3*, A4*, A5*, A6*, all respectively). The second decode circuit 214-2 provides physical addresses (e.g., including bits CS127:CS0) to the data region 212-2 that are based on the second scrambled logical addresses from the scramble circuit 216-1. As a result, two different, scrambled logical addresses are provided to the first and second decode circuits 214-1, 214-2, which in turn will provide two different physical addresses to the data regions 212-1, 212-2 associated with the common logical address CA. As mentioned above, in some examples, only a few bits may be swapped between two different data regions, as illustrated in FIG. 2, whereas in other regions, a different pair may be swapped in each of the data regions, or all of the bits may be uniquely scrambled for each of the data regions.

In some embodiments, and as illustrated in FIG. 2, the two decode circuits 214-1, 214-2 may be identical. In these embodiments, even though the internal circuitry of the decode circuits 214-1, 214-2 may be identical, the scrambled logical addresses provided by the two scramble circuits 216-1, 216-2 are different for any given common logical address, and thus the two decode circuits 214-1, 214-2 may access different physical columns in the data regions 212-1, 212-2 responsive to the same, common logical address.

Figure 3:
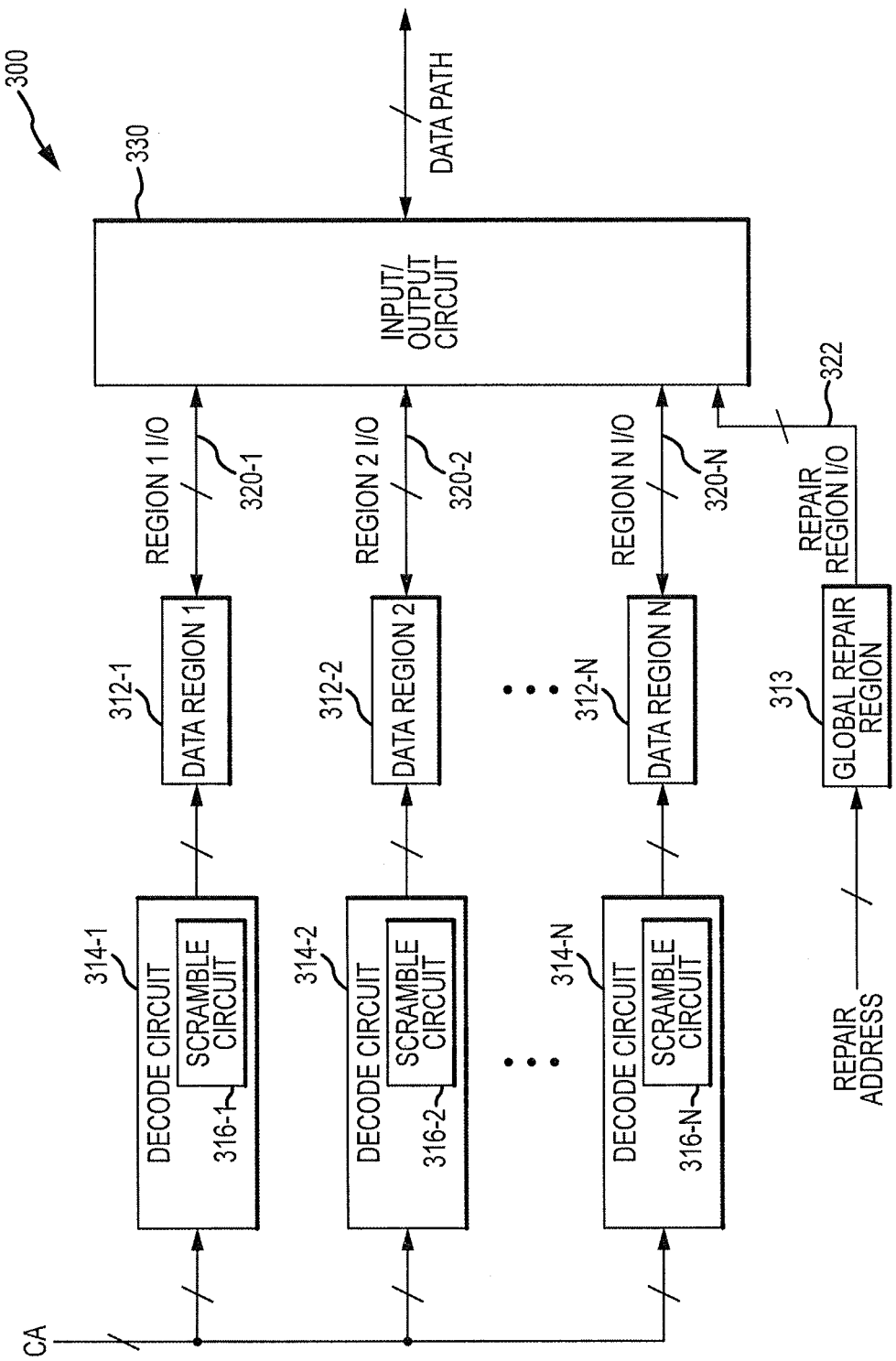
FIG. 3 is a block diagram of an apparatus with address scrambling according to an embodiment of the invention.

FIG. 3 illustrates an apparatus 300 according to an embodiment of the invention. The apparatus 300 includes an input/output circuit 330 coupled to the plurality of data regions 312-1, 312-2 . . . 312-N, with respective I/O buses 320-1, 320-2 . . . 320-N coupling the respective data regions 312-1, 312-2 . . . 312-N to the input/output circuit 330. The apparatus 300 also includes a global repair region 313 that is coupled to the input/output circuit 330 via a repair region I/O bus 322. The global repair region 313 includes redundant circuitry that can be used to repair portions (e.g., columns) of any one or a plurality of the data regions 312-1, 312-2 . . . 312-N. The apparatus 300 illustrated in FIG. 3 is similar to the apparatus 100 illustrated in FIG. 1, except that the first and second decode circuits 314-1, 314-2 . . . 314-N in FIG. 3 receive a common logical address CA and scramble the received common logical address (using, e.g., internal scramble circuits 316-1, 316-2 . . . 316-N) to generate respective physical column addresses to be provided to the respective data regions 312-1, 312-2 . . . 312-N to access data therein, rather than receiving scrambled logical addresses from scramble circuits coupled to the decode circuits, as is the case in FIG. 1.

Figure 4:
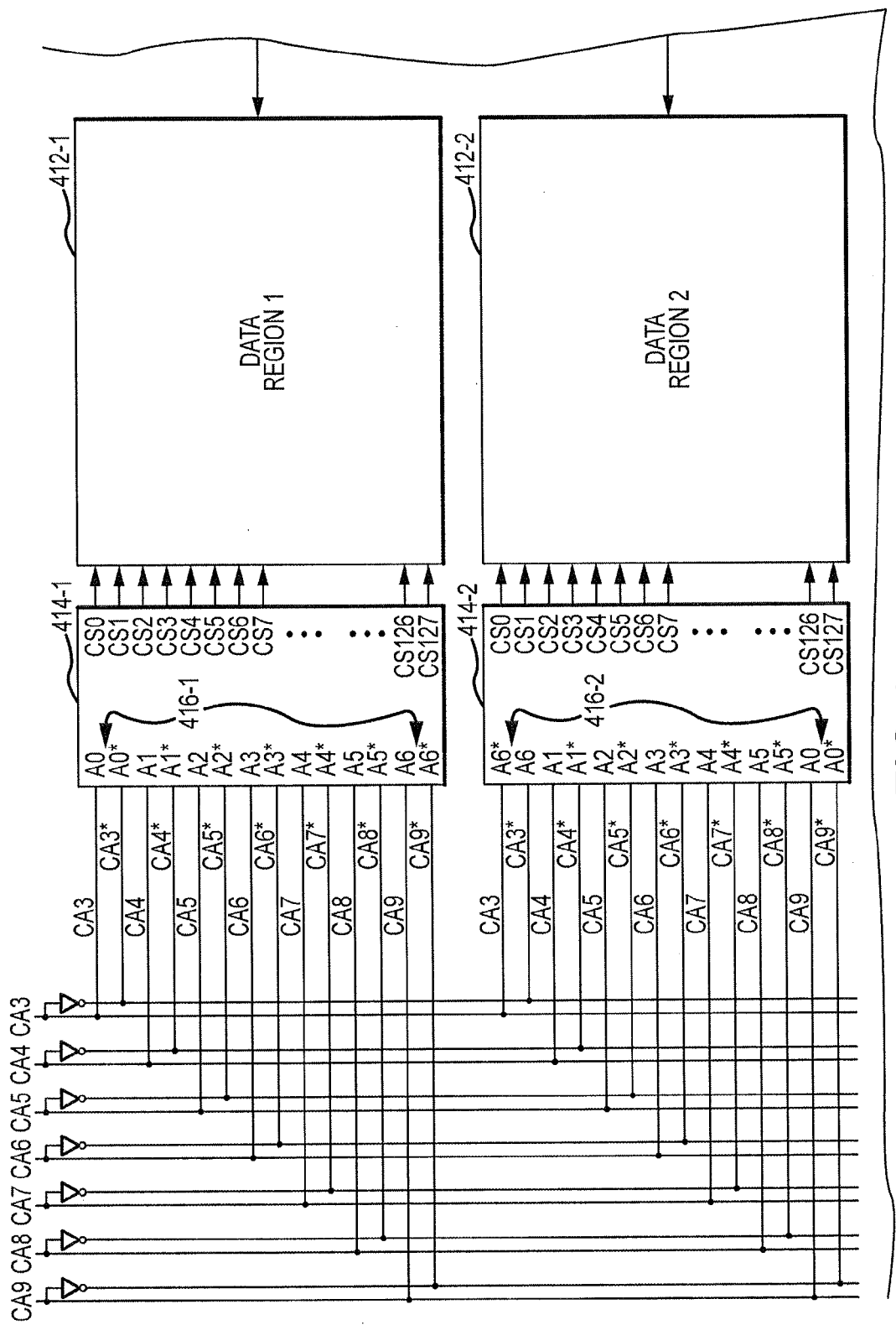
FIG. 4 is an enlarged portion of the apparatus in FIG. 3 to an embodiment of the invention.

With reference now to FIG. 4, a portion of the apparatus 300 in FIG. 3 is illustrated according to an embodiment of the invention. Similar to FIG. 2, FIG. 4 illustrates two decode circuits 414-1, 414-2 and two data regions 412-1, 412-2. Unlike in FIG. 2, however, the first and second decode circuits 414-1, 414-2 in FIG. 4 receive the same bits of the common logical address CA in the same order, but, the first and second decode circuits 414-1, 414-2 in FIG. 4 are not identical. The first and second decode circuits 414-1, 414-2 may not be identical in that their internal components and wiring may be different. For example, they may have respective internal scramble circuits 316-1, 316-2 as illustrated in FIG. 3 that are differently configured. In the embodiment illustrated in FIG. 3, for example, a difference between the first and second decode circuits 414-1, 414-2 is represented by the configuration of the inputs to the first and second decode circuits 414-1, 414-2. The common logical address bits CA9:CA3, CA9*:CA3* are provided to the first decode circuit 414-1 as A6:A0 and A6*:A0* and are provided to the second decode circuit 414-2 as A0:A6* and A0*:A6, respectively. In this manner, even though the same common logical address is provided to the first and second decode circuits 414-1, 414-2, the first and second decode circuits 414-1, 414-2 provide different physical column addresses CS127:CS0 to the data regions 412-1, 412-2.

Figure 5:
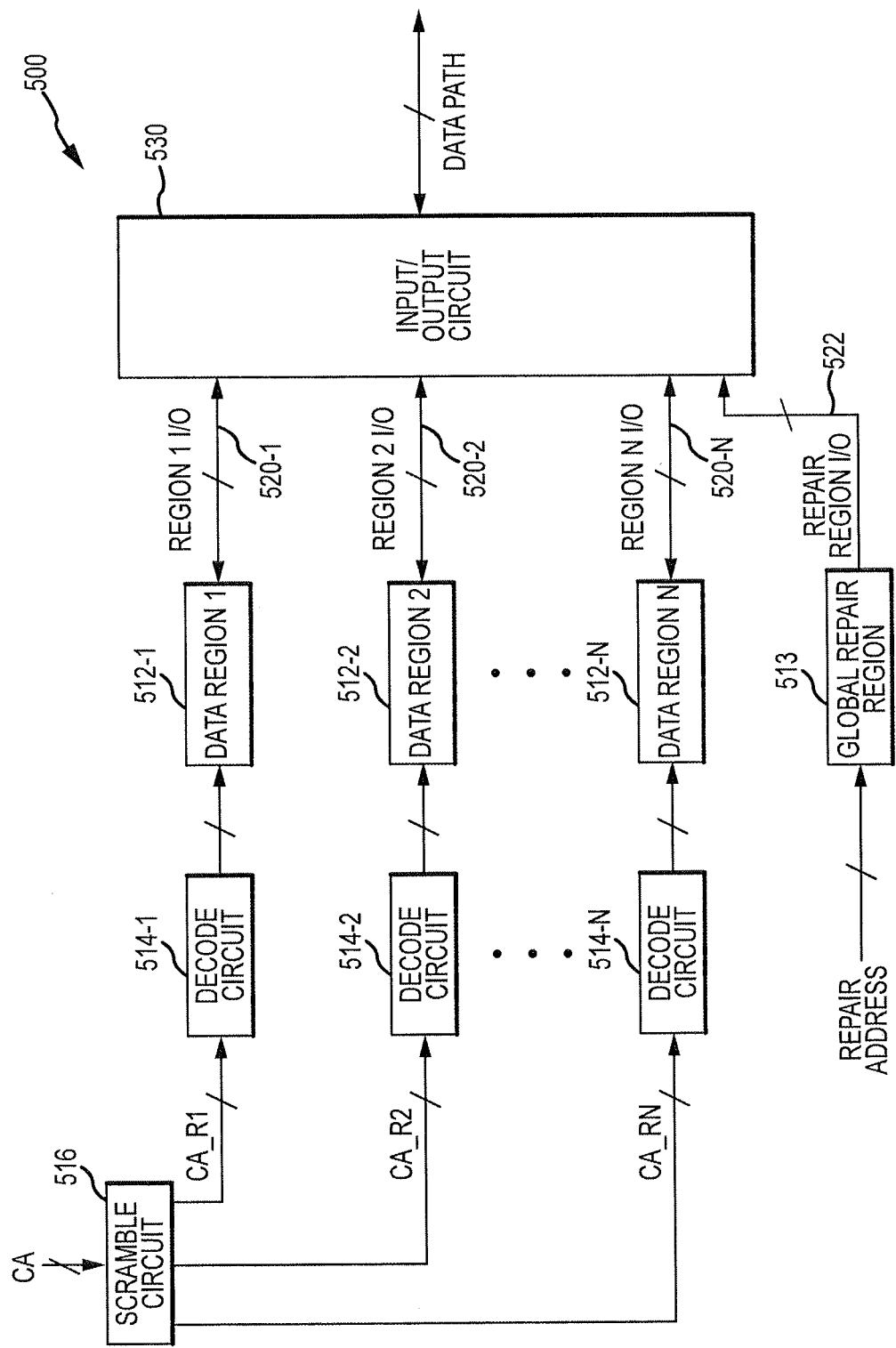
FIG. 5 is a block diagram of an apparatus with address scrambling according to an embodiment of the invention.

FIG. 5 illustrates an apparatus 500 according to an embodiment of the invention. The apparatus 500 includes an input/output circuit 530 coupled to the plurality of data regions 512-1, 512-2 . . . 512-N, with respective I/O buses 520-1, 520-2 . . . 520-N coupling the respective data regions 512-1, 512-2 . . . 512-N to the input/output circuit 530. The apparatus 500 also includes a global repair region 513 that is coupled to the input/output circuit 530 via a repair region I/O bus 522. The global repair region 513 includes redundant circuitry that can be used to repair portions (e.g., columns) of any one or a plurality of the data regions 512-1, 512-2 . . . 512-N. The apparatus 500 illustrated in FIG. 5 is also similar to the apparatus 100 illustrated in FIG. 1, except that a single scramble circuit 516 receives a common logical address CA, and provides respective scrambled logical addresses CA_R1, CA_R2 . . . CA_RN to respective decode circuits 514-1, 514-2 . . . 514-N (which decode circuits 514-1, 514-2 . . . 514-N may be identical), which in turn provide respective physical addresses to the data regions 512-1, 512-2 . . . 512-N responsive to the received scrambled logical addresses CA_R1, CA_R2 . . . CA_RN.

Figure 6:
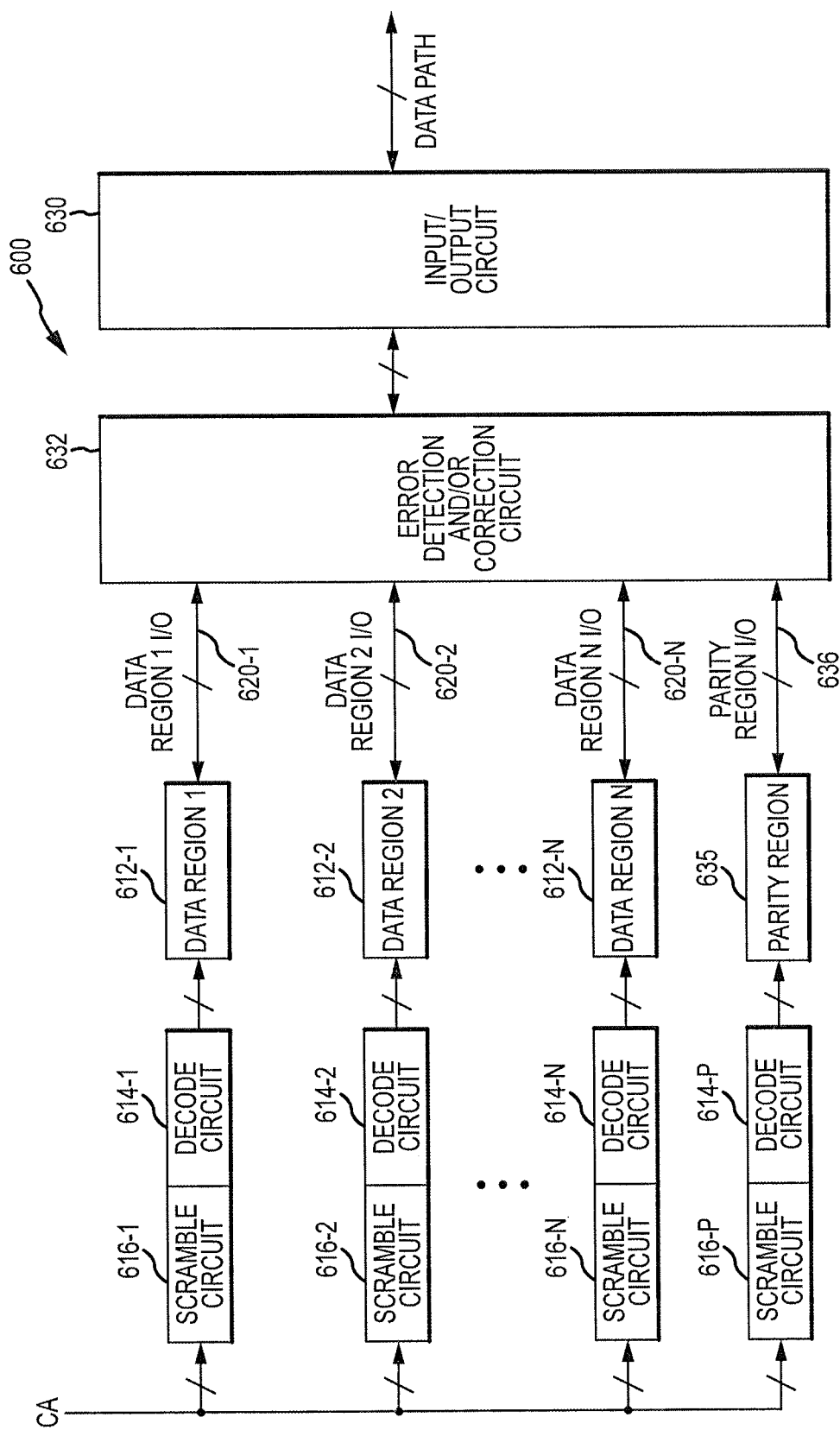
FIG. 6 is a block diagram of an apparatus with address scrambling according to an embodiment of the invention.

FIG. 6 illustrates another example of an apparatus 600 according to an embodiment of the invention. The apparatus 600 illustrated in FIG. 6 is similar to the apparatus 100 illustrated in FIG. 1, except that the apparatus 600 illustrated in FIG. 6 includes a parity region 635 and an error detection and/or correction circuit 632. The apparatus 600 may also include a decode circuit 614-P coupled to the parity region 635 and/or a scramble circuit 616-P associated with the parity region 635. The parity region 635 is coupled to the error detection and/or correction circuit 632 via an I/O bus 636, and each of the data regions 612-1, 612-2 . . . 612-N are also coupled to the error detection and/or correction circuit 635 over respective I/O buses 620-1, 620-2 . . . 620-N. The error detection and/or correction circuit 632 is in turn coupled to the input/output circuit 630.

The parity region 635 stores parity data. The parity data may be any data that can be used to detect and/or correct an error. For example, the parity data may be simple parity data, hamming code data, cyclic redundancy check data, error correction data, forward error correction data, and so forth. The error detection and/or correction circuit 630 can detect and/or correct errors in data stored in the plurality of data regions using the parity data stored in the parity region 635. The error detection and/or correction circuit 630 may be positioned in the sense amplifier of a DRAM memory in some embodiments.

Similar to the operation of the apparatus in FIG. 1, when a common logical address CA is provided to the plurality of scramble circuits 616-1, 616-2, . . . 616-N, 616-P, the scramble circuits 616-1, 616-2, . . . 616-N provide scrambled logical addresses to the plurality of decode circuits 614-1, 614-2, . . . 614-N, which in turn provide different physical addresses to the plurality of data regions 612-1, 612-2, . . . 612-N, and columns associated with the respective physical addresses are accessed (e.g., for read and/or write access) in each of the plurality of data regions 612-1, 612-2, . . . 612-N. During a read, for example, each of the plurality of data regions 612-1, 612-2, . . . 612-N may provide 8 bits of data to the error detection and/or correction circuit 632 via their respective I/O buses 620-1, 620-2, . . . 620-N. Similarly, the parity region 635 may provide, for example, 7 bits of parity information to the error detection and/or correction circuit 632 via the parity region I/O bus 636 responsive to receiving the common logical address CA. The error detection and/or correction circuit 632 may perform an operation on the data received from the plurality of data regions 612-1, 612-2, . . . 612-N and the parity region 635 in order to detect and/or correct one or more errors in the data received. The error(s) may be a result of, for example, hardware defects in one or more of the data regions 612-1, 612-2, . . . 612-N, and/or may be soft errors (e.g., caused by one or more regions of the data regions 612-1, 612-2, . . . 612-N losing charge due to leakage or other interference).

As mentioned above, the data regions 612-1, 612-2, . . . 612-N may have similar topographies, and thus may have similar regions where defects or soft errors are likely to occur. As such, scrambling addresses, as described above with reference to FIGS. 1 through 5 may help reduce the chance that multiple bit errors will be provided in a single data read to the error detection and/or correction circuit 632—which in turn increases the likelihood that the error detection and/or correction circuit 632 can properly identify and/or correct one or more errors in the data. By scrambling a common logical address CA to in turn provide a plurality of different physical addresses to the data regions 612-1, 612-2, . . . 612-N, data may be stored and read out of the data regions 612-1, 612-2, . . . 612-N in a "random" order—though, as mentioned above, the order is only random in that the address scramble is designed so that similar physical addresses in the data regions 612-1, 612-2, . . . 612-N that are likely to fail are not mapped to a single, common logical address.

Figure 7:
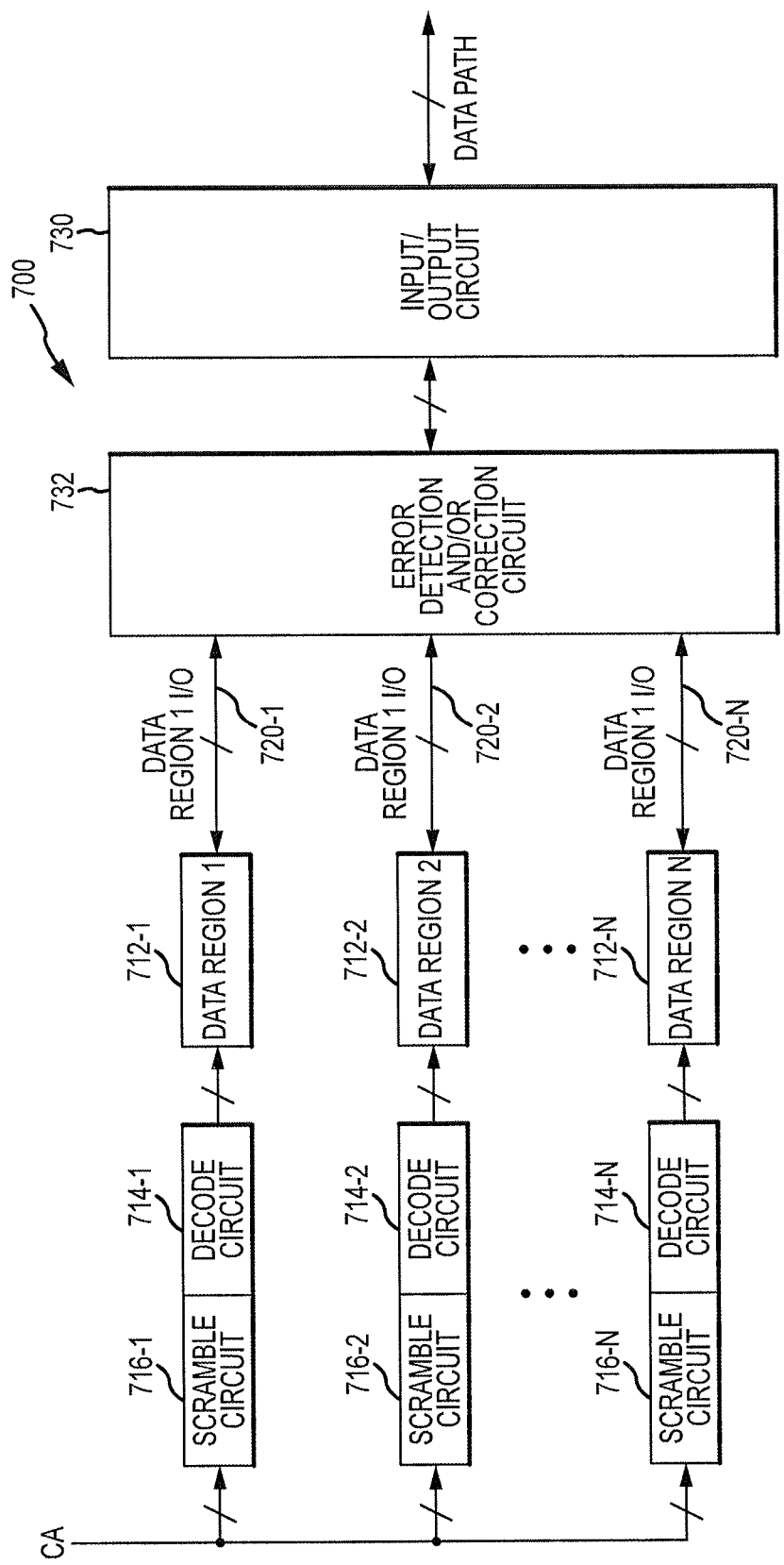
FIG. 7 is a block diagram of an apparatus with address scrambling according to an embodiment of the invention.

FIG. 7 illustrates another example of an apparatus 700 according to an embodiment of the invention. The apparatus 700 includes an error detection and/or correction circuit 732 coupled to data regions 712-1, 712-2, . . . 712-N through respective I/O buses 720-1, 720-2, . . . 720-N. The error detection and/or correction circuit 732 is in turn coupled to the input/output circuit 730. The apparatus 700 illustrated in FIG. 7 is similar to the apparatus 600 illustrated in FIG. 6, except that the apparatus 700 illustrated in FIG. 7 does not have a dedicated parity region. Instead, parity data is integrally stored within each of the plurality of data regions 712-1, 712-2, . . . 712-N—for example, each data region 712-1, 712-2, . . . 712-N may store one bit of parity data, or different data regions 712-1, 712-2, . . . 712-N may store different amounts of parity data.

With reference to FIGS. 6 and 7, apparatuses 600 and 700 are described as including scramble circuits 616-1, 616-2, . . . 616-N, 716-1, 716-2, . . . 716-N similar to those in FIG. 1; that is the scramble circuits 616-1, 616-2, . . . 616-N, 716-1, 716-2, . . . 716-N receive a common logical address CA and provide scrambled logical addresses to the respective decode circuits 614-1, 614-2, . . . 614-N, 714-1, 714-2, . . . 714-N. In another embodiment, however, the apparatuses 600 and 700, either with the parity data stored in a dedicated parity region 635 or with the parity data stored in respective data regions 712-1, 712-2 . . . 712-N, may include decode circuits similar to those illustrated in FIG. 3 (i.e., that receive a common logical signal and provide a plurality of different physical addresses to different data regions), or may include a scramble circuit similar to that illustrated in FIG. 5 (i.e., that receives a common logical signal and provides a plurality of different scrambled logical signals to the decode circuits). Also, in some embodiments, an apparatus may include both a global repair region and error detection and/or correction circuitry—such as the parity region 635 and the error detection and/or correction circuit 630—whereas in other embodiments, an apparatus may only include one of a global repair region or error detection and/or correction circuitry.

Figure 8:
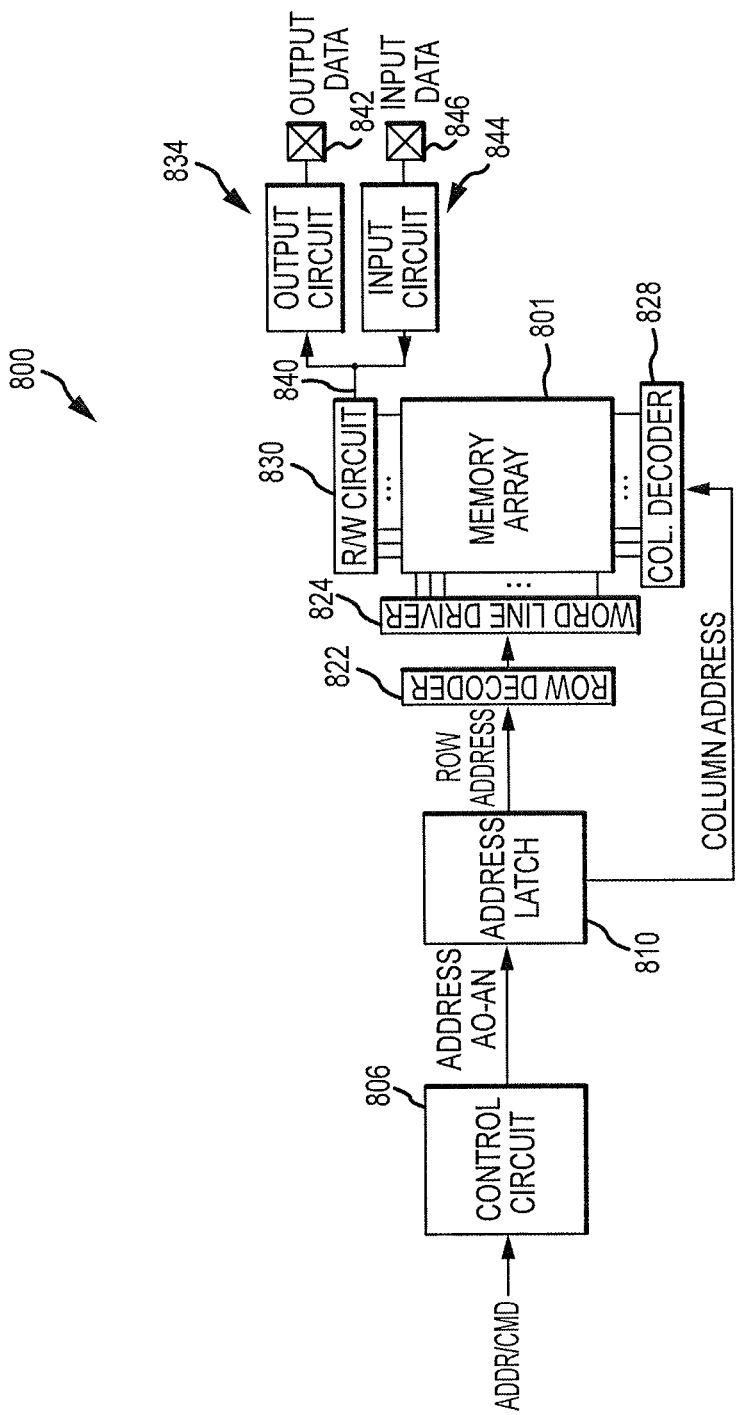
FIG. 8 is a block diagram of a memory according to an embodiment of the invention.

FIG. 8 illustrates a portion of a memory 800 according to an embodiment of the present invention. The memory 800 includes an array 801 of memory cells, which may be, for example, DRAM memory cells, SRAM memory cells, flash memory cells, or some other types of memory cells. The memory 800 includes a control circuit 806 that receives memory commands and addresses through an ADDR/CMD bus. The control circuit 806 provides control signals, based on the commands received through the ADDR/CMD bus. The control circuit 806 also provides row and column addresses to the memory 800 through an address bus and an address latch 810. The address latch then outputs separate column addresses and separate row addresses.

The row and column addresses are provided by the address latch 810 to a row address decoder 822 and a column address decoder 828, respectively. The column address decoder 828 selects bit lines extending through the array 802 associated with respective column addresses. The row address decoder 822 is connected to word line driver 824 that activates respective rows of memory cells in the array 802 associated with received row addresses. The selected data line (e.g., a bit line or bit lines) associated with a received column address are coupled to a read/write circuitry 830 to provide read data to a data output circuit 834 via an input-output data bus 840. An output pad 842 coupled to the data output circuit 834 is used for electrically coupling to the memory 800. Write data are provided to the memory array 802 through a data input circuit 844 and the memory array read/write circuitry 830. An input pad 846 coupled to the data input circuit 842 is used for electrically coupling to the memory 800. The control circuit 806 responds to memory commands and addresses provided to the ADDR/CMD bus to perform various operations on the memory array 802. In particular, the control circuit 806 is used to provide internal control signals to read data from and write data to the memory array 802.

In some embodiments, the row address decoder 822 and/or the column address decoder 828 may scramble a logical address received from the address latch 810 and, in response, provide scrambled logical addresses and/or different physical addresses to different data regions within the array 801 in order to improve the use of redundant circuitry in a global repair region of the array 801 as described above with reference to FIGS. 1 through 5, and/or to improve the use of error detection and/or correction as described above with reference to FIGS. 6 and 7. Also, in some embodiments, the input circuit 844 and the output circuit 834 may be implemented in one of the input/output circuits 130, 330, 530, 630, 730 described above, and the read/write circuit 830 in FIG. 8 may include an error detection and/or correction circuit, as described above.

From the foregoing it will be appreciated that, although specific embodiments of the invention have been described herein for purposes of illustration, various modifications may be made without deviating from the spirit and scope of the invention. For example, FIGS. 1, 2, 3, 4, 5, 6, 7 illustrate embodiments of decode circuits and scramble circuits, FIGS. 1, 3, 5, 6, an 7 illustrate embodiments of data regions, FIGS. 1, 3, 5, 6, and 7 illustrate embodiments of input/output circuits, FIGS. 1, 3, and 5 illustrate embodiments of global repair regions, and so forth. However, other decode circuits, scramble circuits, data regions, input/output circuits, global repair regions, and so forth may be used, which are not limited to having the same design, and may be of different designs and include circuitry different from the circuitry in the embodiments illustrated in these figures.

In some embodiments, an apparatus may include a selector (not illustrated) that can be used to selectively scramble or not scramble the common logical address CA.

Furthermore, as used herein, a column may include storage for one or a plurality of bits of data. Also, it will be understood that column is a relative word, and that, in some embodiments, a row could be considered a column. Thus, the use of the word column herein merely indicates a series of locations, and is not limited to a particular arrangement of those locations.

Accordingly, the invention is not limited to the specific embodiments of the invention described herein.

What is claimed is:
1. An apparatus, comprising:
a plurality of data regions, each of the plurality of data regions configured to provide a respective portion of data responsive to a physical address provided by a respective decode circuit, the plurality of data regions configured to provide respective portions of data responsive to a common logical address;

wherein the common logical address is scrambled such that a plurality of different physical addresses are provided to the plurality of data regions.

2. The apparatus of claim 1, further comprising a global repair region with a plurality of redundant circuitry configured for use in repairing inoperable circuitry in one or more of the plurality of data regions.

3. The apparatus of claim 1, further comprising a parity region configured to store parity data, and an error detection and/or correction circuit configured to detect and/or correct errors in data stored in the plurality of data regions using the parity data.

4. The apparatus of claim 3, wherein the parity data comprises error correction code information.

5. The apparatus of claim 1, wherein each of the plurality of data regions includes parity information for the data stored therein.

6. The apparatus of claim 1, wherein the plurality of data regions is also configured to receive and store respective portions of data at locations associated with the plurality of different physical addresses.

7. An apparatus, comprising:
first and second data regions each including a plurality of columns accessible by respective physical column addresses; and
first and second decode circuits configured to provide respective first and second physical column addresses to the first and second data regions responsive to a common logical address, the first and second physical column addresses provided by associating the common logical address with the first physical column address in the first data region and with the second physical column address in the second data region.

8. The apparatus of claim 7, further comprising a scramble circuit coupled to each of the first and second decode circuits, each scramble circuit being configured to scramble the common logical address and provide respective scrambled logical addresses to respective decode circuits.

9. The apparatus of claim 7, wherein the first and second decode circuits receive the common logical address and scramble the common logical address to generate the first and second physical column addresses.

10. The apparatus of claim 7, further comprising a scramble circuit configured to receive the common logical address and provide scrambled logical addresses to the first and second decode circuits, the first and second decode circuits configured to provide the first and second physical column addresses responsive to the scrambled logical addresses.

11. The apparatus of claim 7, further comprising third and fourth data regions, each with a plurality of columns, wherein a common physical address among the first, second, third, and fourth regions is associated with a different logical address in each of the first, second, third and fourth regions.

12. The apparatus of claim 7, wherein the physical addresses of a plurality of columns in the first data region are associated with logical addresses different than the logical addresses for similar columns in the second data region.

13. An apparatus, comprising:
first and second data regions each including a location associated with a similar physical address;
first and second decode circuits configured to associate the similar physical address of the first and second data regions with different logical addresses; and
a scramble circuit configured to provide different scrambled logical addresses to the first and second decode circuits responsive to the different logical addresses.

14. The apparatus of claim 13, wherein the location associated with the similar physical address in each of the first and second data regions is inoperable or determined to be likely to be inoperable.

15. A method, comprising:
providing a common logical address;
scrambling the common logical address to be associated with a plurality of different physical addresses in a plurality of different data regions; and
providing respective ones of the plurality of different physical addresses to respective ones of the plurality of different data regions.

16. The method of claim 15, wherein as a result of the scrambling, no logical address is associated with two different columns in a global repair region.

17. The method of claim 15, further comprising repairing an inoperable portion of a first data region using a redundant portion of a global repair region.

18. The method of claim 17, wherein the plurality of different physical addresses for the plurality of different data regions are associated with the same common logical address in each of the plurality of different data regions.

19. The method of claim 15, further comprising accessing portions of data in the plurality of different data regions responsive to providing respective ones of the plurality of different physical addresses.

20. The method of claim 19, further comprising using an error detection and/or correction circuit to detect and/or correct errors in the portions of data accessed from the plurality of different data regions.

21. The method of claim 15, further comprising writing portions of data to the plurality of different data regions responsive to providing respective ones of the plurality of different data regions.

22. The method of claim 15, wherein the scrambling comprises swapping two or more bits of the common logical address to provide one of the plurality of different physical addresses.

23. The method of claim 15, wherein the scrambling comprises inverting the common logical address.

24. A method, comprising:
determining a common physical address across a plurality of data regions that is likely to be inoperable; and
associating the common physical address with a plurality of different logical addresses, with each of the plurality of data regions being associated with a different scrambled logical address for the common physical address.

25. The method of claim 24, wherein each of the plurality of data regions is associated with a different scrambled logical address by blowing one or more fuses during manufacturing.

26. The method of claim 24, further comprising:
testing the plurality of data regions to determine that a portion is inoperable; and
repairing the inoperable portion by blowing one or more fuses to reroute data to and from a repair region instead of the inoperable portion.

27. The method of claim 24, further comprising correcting soft bit errors using parity data stored in the plurality of data regions.

28. The method of claim 24, wherein the scrambling effectively randomizes the plurality of different logical addresses with respect to physical locations in the plurality of data regions.

29. A method, comprising:
- associating a common logical address with a first physical address in a first data region;
- associating the common logical address with a second physical address in a second data region; and
- accessing a first location associated with the first physical address in the first data region and a second location associated with the second physical address in the second region responsive to providing the common logical address to one or more decode circuits.

30. The method of claim 29, wherein the first and second data regions have a substantially similar topography.

31. The method of claim 30, wherein the first location is an edge portion of the first data region, and the second location is an inner portion of the second data region.

32. The method of claim 29, wherein the logical address is a first logical address, further comprising:
- associating a second logical address with a third physical address in the first data region; and
- associating the second logical address with a fourth physical address in the second data region;
- wherein associating the first and second logical addresses with the first, second, third, and fourth physical addresses is based on known or expected defect patterns in the first and second data regions.

33. An apparatus, comprising:
- first and second data regions each including a location associated with a similar physical address;
- first and second decode circuits configured to associate the similar physical address of the first and second data regions with different logical addresses; and
- a plurality of scramble circuits coupled to respective decode circuits and configured to provide scrambled logical addresses to the respective decode circuits.

* * * * *